(12) United States Patent
Sato et al.

(10) Patent No.: US 9,881,799 B2
(45) Date of Patent: Jan. 30, 2018

(54) SUBSTRATE LIQUID PROCESSING APPARATUS, SUBSTRATE LIQUID PROCESSING METHOD, AND COMPUTER-READABLE STORAGE MEDIUM

(71) Applicant: Tokyo Electron Limited, Tokyo (JP)

(72) Inventors: Hideaki Sato, Kumamoto (JP); Takami Satoh, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/002,546

(22) Filed: Jan. 21, 2016

(65) Prior Publication Data

US 2016/0225683 A1 Aug. 4, 2016

(30) Foreign Application Priority Data

Jan. 30, 2015 (JP) ................................. 2015-016198

(51) Int. Cl.
  *H01L 21/00* (2006.01)
  *H01L 21/306* (2006.01)
  *H01L 21/67* (2006.01)

(52) U.S. Cl.
  CPC .. *H01L 21/30604* (2013.01); *H01L 21/67086* (2013.01); *H01L 21/67253* (2013.01)

(58) Field of Classification Search
  USPC .............................. 438/5; 156/345.15, 345.1
  See application file for complete search history.

(56) References Cited

U.S. PATENT DOCUMENTS

2007/0178020 A1*  8/2007  Atlas .................. G05D 23/1919
                                                    422/105
2009/0087566 A1*  4/2009  Kimura ..................... B08B 3/08
                                                    427/299

FOREIGN PATENT DOCUMENTS

JP            2001-023952 A      1/2001

* cited by examiner

*Primary Examiner* — Timor Karimy
(74) *Attorney, Agent, or Firm* — Abelman, Frayne & Schwab

(57) ABSTRACT

Disclosed is a substrate liquid processing apparatus including a processing liquid storage unit that stores a processing liquid; a processing liquid supply unit that supplies the processing liquid to the processing liquid storage unit; a processing liquid circulation unit that circulates the processing liquid inside the processing liquid storage unit; a processing liquid discharge unit that discharges the processing liquid; a concentration sensor that measures a concentration in the processing liquid; and a controller that controls the processing liquid supply unit. The controller controls the processing liquid circulation unit to circulate the processing liquid, the processing liquid discharge unit to discharge the circulated processing liquid intermittently at a predetermined timing or continuously for a predetermined period of time, the processing liquid supply unit to newly supply the processing liquid, and the concentration sensor to measure the concentration in the processing liquid at a predetermined timing.

11 Claims, 5 Drawing Sheets

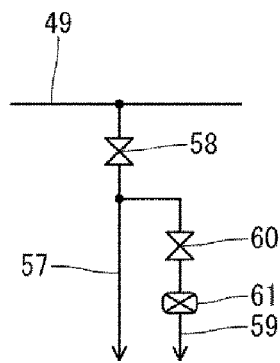 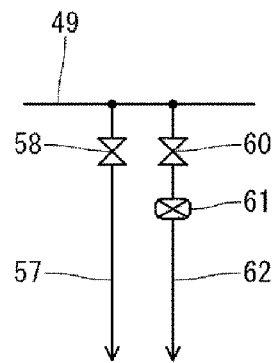 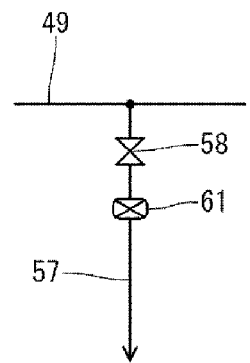
*FIG.3A*   *FIG.3B*   *FIG.3C*

SUBSTRATE LIQUID PROCESSING APPARATUS, SUBSTRATE LIQUID PROCESSING METHOD, AND COMPUTER-READABLE STORAGE MEDIUM

CROSS-REFERENCE TO RELATED APPLICATIONS

This application is based on and claims priority from Japanese Patent Application No. 2015-016198, filed on Jan. 30, 2015, with the Japan Patent Office, the disclosure of which is incorporated herein in its entirety by reference.

TECHNICAL FIELD

The present disclosure relates to a substrate liquid processing apparatus for measuring a concentration (e.g., silicon concentration) in a processing liquid for processing a substrate, a substrate liquid processing method, and a computer-readable storage medium that stores a substrate liquid processing program.

BACKGROUND

In manufacturing, for example, a semiconductor part or a flat panel display, a substrate liquid processing apparatus has been used for performing an etching processing on a substrate such as, for example, a semiconductor wafer or a liquid crystal substrate with an etching liquid (a processing liquid).

A conventional substrate liquid processing apparatus includes a processing liquid storage unit that stores a processing liquid for processing a substrate, a processing liquid supply unit that supplies the processing liquid to the processing liquid storage unit, and a processing liquid circulation unit that circulates the processing liquid stored in the processing liquid storage unit to perform, for example, heating of the processing liquid.

In the substrate liquid processing apparatus, a plurality of substrates are immersed in the processing liquid stored in the processing liquid storage unit, so that the substrates are subjected to a liquid processing with the processing liquid. Further, in the substrate liquid processing apparatus, the processing liquid supplied from the processing liquid supply unit is circulated in the processing liquid circulation unit and heated to a predetermined temperature.

In the substrate liquid processing apparatus, when the substrates are repeatedly processed with the processing liquid, the concentration of, for example, impurities, which are contained in the processing liquid by the processing of the substrates, increases. Thus, the substrates may not be satisfactorily processed. For example, when the substrates are subjected to an etching processing with an aqueous phosphoric acid solution (an etching liquid), the capability (etching rate) of the processing liquid depends on the silicon concentration in the processing liquid. Thus, the silicon concentration in the processing liquid needs to be maintained in a predetermined range. However, the repetition of the processing of the substrates increases the silicon concentration in the etching liquid and decreases the capability of the processing liquid. Thus, the substrates may not be satisfactorily etched (see, e.g., Japanese Patent Laid-Open Publication No. 2001-23952).

Accordingly, in the conventional substrate liquid processing apparatus, a concentration sensor is provided in the processing liquid storage unit or the processing liquid circulation unit to measure the silicon concentration in the processing liquid.

SUMMARY

The present disclosure provides a substrate liquid processing apparatus including: a processing liquid storage unit configured to store a processing liquid for processing a substrate; a processing liquid supply unit configured to supply the processing liquid to the processing liquid storage unit; a processing liquid circulation unit configured to circulate the processing liquid inside the processing liquid storage unit; a processing liquid discharge unit branched from the processing liquid circulation unit and configured to discharge the processing liquid; a concentration sensor provided in the processing liquid discharge unit and configured to measure a concentration in the processing liquid; and a controller configured to control the processing liquid supply unit. The controller controls the processing liquid circulation unit to circulate the processing liquid, the processing liquid discharge unit to discharge the circulated processing liquid intermittently at a predetermined timing or continuously for a predetermined period of time, the processing liquid supply unit to newly supply the processing liquid, and the concentration sensor to measure the concentration in the processing liquid at a predetermined timing with respect to the discharged processing liquid.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 3A to 3C are explanatory views illustrating a processing liquid discharge unit.

DETAILED DESCRIPTION

Figure 1:
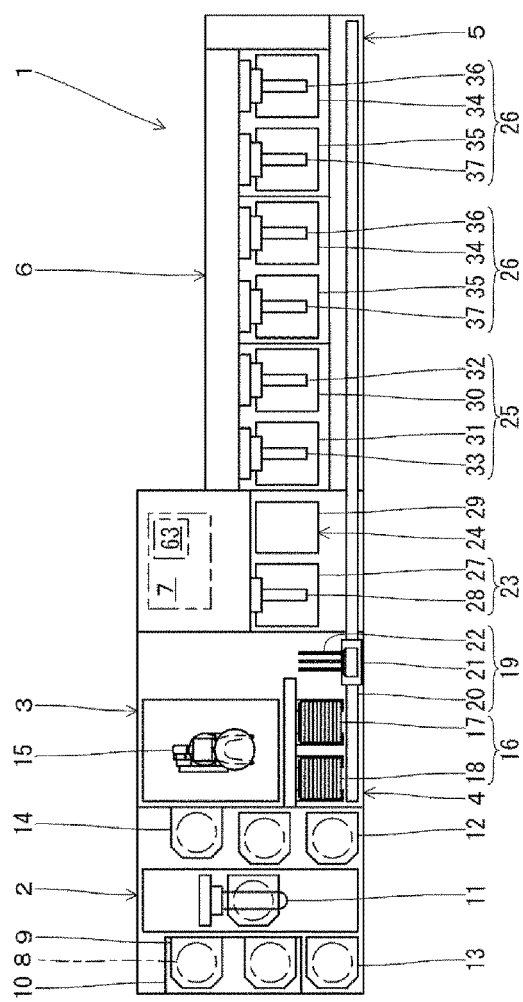
FIG. 1 is an explanatory plan view illustrating a substrate liquid processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the conventional substrate liquid processing apparatus, since the concentration sensor is provided in the processing liquid storage unit or the processing liquid circulation unit, the concentration sensor is always in contact with the process liquid.

Therefore, in the conventional substrate liquid processing apparatus, the concentration sensor may be eroded by the processing liquid, or the impurities contained in the processing liquid may adhere to the concentration sensor, leading to failure or malfunction of the concentration sensor.

Further, in the conventional substrate liquid processing apparatus, dusts may be precipitated from the concentration sensor and incorporated into the processing liquid. Thus, when the substrate is processed with the processing liquid, particles may be attached to the substrate. Therefore, the substrate may not be satisfactorily subjected to the liquid processing.

An aspect of the present disclosure is to provide a substrate liquid processing apparatus including: a processing liquid storage unit configured to store a processing liquid for processing a substrate; a processing liquid supply unit configured to supply the processing liquid to the processing liquid storage unit; a processing liquid circulation unit configured to circulate the processing liquid inside the processing liquid storage unit; a processing liquid discharge unit branched from the processing liquid circulation unit and configured to discharge the processing liquid; a concentration sensor provided in the processing liquid discharge unit and configured to measure a concentration in the processing liquid; and a controller configured to control the processing liquid supply unit. The controller controls the processing liquid circulation unit to circulate the processing liquid, the processing liquid discharge unit to discharge the circulated processing liquid intermittently at a predetermined timing or continuously for a predetermined period of time, the processing liquid supply unit to newly supply the processing liquid, and the concentration sensor to measure the concentration in the processing liquid at a predetermined timing with respect to the discharged processing liquid.

In the above-described substrate liquid processing apparatus, the concentration sensor is provided in a bypass flow path branched from the processing discharge unit.

In the above-described substrate liquid processing apparatus, the predetermined timing of measuring the concentration in the processing liquid by the concentration sensor is set when the substrate is processed with the processing liquid.

In the above-described substrate liquid processing apparatus, the predetermined timing of measuring the concentration in the processing liquid by the concentration sensor is set to be less frequent than the predetermined timing of discharging the processing liquid from the processing liquid discharge unit.

In the above-described substrate liquid processing apparatus, a silicon wafer is used as the substrate, and the concentration sensor measures a concentration of silicon in the processing liquid.

Another aspect of the present disclosure is to provide a substrate liquid processing method including: storing a processing liquid for processing a substrate in a processing liquid storage unit; circulating the processing liquid by a processing liquid circulation unit; discharging the circulated processing liquid intermittently at a predetermined timing or continuously for a predetermined period of time from a processing liquid discharge unit branched in the middle of the processing liquid circulation unit; newly supplying the processing liquid from a processing liquid supply unit; and measuring a concentration in the processing liquid at a predetermined timing with respect to the discharged processing liquid, by a concentration sensor provided in the processing liquid discharge unit In the above-described substrate liquid processing method, the processing liquid discharged from the processing liquid discharge unit is allowed to flow in a bypass flow path branched in the middle of the processing discharge unit, and the concentration in the processing liquid is measured by the concentration sensor provided in the bypass flow path.

In the above-described substrate liquid processing method, the predetermined timing of measuring the concentration in the processing liquid by the concentration sensor is set when the substrate is processed with the processing liquid.

A further aspect of the present disclosure is to provide a non-transitory computer-readable storage medium that stores a computer-executable program for performing a liquid processing on a substrate using a substrate liquid processing apparatus including: a processing liquid storage unit configured to store a processing liquid for processing a substrate; a processing liquid supply unit configured to supply the processing liquid to the processing liquid storage unit; a processing liquid circulation unit configured to circulate the processing liquid inside the processing liquid storage unit; a processing liquid discharge unit branched from the processing liquid circulation unit and configured to discharge the processing liquid; and a concentration sensor provided in the processing liquid discharge unit and configured to measure a concentration in the processing liquid. When executed, the program causes a computer to control the processing liquid circulation unit to circulate the processing liquid, the processing liquid discharge unit to discharge the circulated processing liquid intermittently at a predetermined timing or continuously for a predetermined period of time, the processing liquid supply unit to newly supply the processing liquid, and the concentration sensor to measure the concentration in the processing liquid at a predetermined timing with respect to the discharged processing liquid.

In the present disclosure, occurrence of failure or malfunction of the concentration sensor may be suppressed, and the substrate may be satisfactorily subjected to the liquid processing.

Hereinafter, descriptions will be made on specific configurations of the substrate liquid processing apparatus, the substrate liquid processing method, and the substrate liquid processing program according to the present disclosure with reference to drawings.

As illustrated in FIG. 1, a substrate liquid processing apparatus 1 includes a carrier carry-in/out unit 2, a lot forming unit 3, a lot mounting unit 4, a lot conveyance unit 5, a lot processing unit 6, and a controller 7.

The carrier carry-in/out unit 2 performs carry-in/out of carriers 9, each of which accommodates a plurality (e.g., twenty five sheets) of substrates (silicon wafers) 8 that are aligned vertically in a horizontal posture.

The carrier carry-in/out unit 2 is provided with a carrier stage 10 on which a plurality of carriers 9 is mounted, a carrier conveyance mechanism 11 that conveys the carriers 9, carrier stocks 12 and 13 that temporarily store the carriers 9, and a carrier mounting unit 14 on which the carriers 9 are mounted. Here, the carrier stock 12 temporarily stores the substrates 8 which will be products before the substrates 8 are processed in the lot processing unit 6. The carrier stock 13 temporarily stores the substrates 8 which will be products after the substrates 8 are processed in the lot processing unit 6.

Then, the carrier carry-in/out unit 2 conveys the carrier 9 carried into the carrier stage 10 from the outside, to the carrier stock 12 or the carrier mounting unit 14 by using the carrier conveyance mechanism 11. Further, the carrier carry-in/out unit 2 conveys the carrier 9 mounted on the carrier mounting unit 14 to the carrier stock 13 or the carrier stage 10 by using the carrier conveyance mechanism 11. The carrier 9 conveyed to the carrier stage 10 is carried to the outside.

The lot forming unit 3 forms a lot by combining the substrates 8 accommodated within one or more carriers 9 with each other. One lot includes a plurality (e.g., fifty sheets) of substrates 8 to be processed at once.

The lot forming unit 3 is provided with a substrate conveyance mechanism 15 that conveys the plurality of substrates 8. Meanwhile, the substrate conveyance mechanism 15 may change the posture of the substrates 8 from a horizontal posture to a vertical posture and from a vertical posture to a horizontal posture during the conveyance of the substrates 8.

Then, the lot forming unit 3 conveys the substrates 8 from the carrier 9 mounted on the carrier mounting unit 14 to the lot mounting unit 4 by using the substrate conveyance mechanism 15 and forms a lot in the lot mounting unit 4. Further, the lot forming unit 3 conveys the lot mounted on the lot mounting unit 4 into the carrier 9 mounted on the carrier mounting unit 14 by using the substrate conveyance mechanism 15. Meanwhile, the substrate conveyance mechanism 15 includes two kinds of substrate supports configured to support the plurality of substrates 8. One is a non-processed substrate support configured to support the substrates 8 before the substrates 8 are processed (conveyed by the lot conveyance unit 5), and the other is a processed substrate support configured to support the substrates 8 after the substrates 8 are processed (conveyed by the lot conveyance unit 5). Accordingly, for example, particles attached to the non-processed substrates 8 are suppressed from being transferred to, for example, the processed substrates 8.

In the lot mounting unit 4, lots which are conveyed between the lot forming unit 3 and the lot processing unit 6 by the lot conveyance unit 5 are temporarily mounted (on standby).

The lot mounting unit 4 includes a carry-in side lot mounting unit 17 on which a non-processed lot (before being conveyed by the lot conveyance unit 5) is mounted, and a carry-out side lot mounting unit 18 on which a processed lot (after being conveyed by the lot conveyance unit 5) is mounted. Lots each of which includes the plurality of substrates 8 in a vertical posture are mounted on the carry-in side lot mounting unit 17 and the carry-out side lot mounting unit 18 to be aligned in the front-rear direction.

In the lot mounting unit 4, the lot formed in the lot forming unit 3 is mounted on the carry-in side lot mounting unit 17, and is carried into the lot processing unit 6 through the lot conveyance unit 5. Further, in the lot mounting unit 4, the lot carried out of the lot processing unit 6 through the lot conveyance unit 5 is mounted on the carry-out side lot mounting unit 18 and is conveyed to the lot forming unit 3.

The lot conveyance unit 5 conveys the lots between the lot mounting unit 4 and the lot processing unit 6 or within the lot processing unit 6.

The lot conveyance unit 5 is provided with a lot conveyance mechanism 19 that conveys lots. The lot conveyance mechanism 19 includes a rail 20 disposed along the lot mounting unit 4 and the lot processing unit 6, and a moving body 21 which holds the plurality of substrates 8 and moves along the rail 20. A substrate holder 22 is provided in the moving body 21 to be movable forward and backward. The substrate holder 22 is configured to hold the plurality of substrates 8 arranged in the vertical posture in the front-rear direction.

The lot conveyance unit 5 receives a lot mounted on the carry-in side lot mounting unit 17 by the substrate holder 22 of the lot conveyance mechanism 19, and delivers the received lot to the lot processing unit 6. Further, the lot conveyance unit 5 receives the lot processed in the lot processing unit 6 by the substrate holder 22 of the lot conveyance mechanism 19, and delivers the received lot to the carry-out side lot mounting unit 18. Further, the lot conveyance unit 5 conveys the lot within the lot processing unit 6 by using the lot conveyance mechanism 19.

The lot processing unit 6 performs processings such as etching, cleaning, or drying, on one lot including the plurality of substrates 8 arranged in the vertical posture in the front-rear direction.

The lot processing unit 6 includes a drying device 23 that dries the substrates 8, a substrate holder cleaning device 24 that cleans the substrate holder 22, a cleaning device 25 that cleans the substrates 8, and two etching devices 26 that etch the substrates 8, which are provided to be aligned.

The drying device 23 includes a substrate elevating mechanism 28 which is provided in a processing bath 27 to be elevatable. A drying processing gas such as, for example, isopropyl alcohol (IPA) is supplied to the processing bath 27. One lot including the plurality of substrates 8 in a vertical posture is held to be aligned in the front-rear direction in the substrate elevating mechanism 28. The drying device 23 receives a lot from the substrate holder 22 of the lot conveyance mechanism 19 by the substrate elevating mechanism 28, and elevates the lot by the substrate elevating mechanism 28 so that the drying processing gas of the processing bath 27 is supplied to the lot to dry the substrates 8. The drying device 23 delivers the lot from the substrate elevating mechanism 28 to the substrate holder 22 of the lot conveyance mechanism 19.

The substrate holder cleaning device 24 is configured to supply a cleaning processing liquid and a drying gas to a processing bath 29. The substrate holder cleaning device 24 supplies the cleaning processing liquid to the substrate holder 22 of the lot conveyance mechanism 19 and then supplies the drying gas to clean the substrate holder 22.

The cleaning device 25 includes a cleaning processing bath 30 and a rinse processing bath 31, and substrate elevating mechanisms 32 and 33 are provided in the processing baths 30 and 31, respectively to be elevatable. A cleaning processing liquid (e.g., SC-1) is stored in the cleaning processing bath 30. A rinse processing liquid (e.g., deionized water) is stored in the rinse processing bath 31.

Each of the etching devices 26 includes an etching processing bath 34 and a rinse processing bath 35, and substrate elevating mechanisms 36 and 37 are provided in the processing baths 34 and 35, respectively to be elevatable. An etching processing liquid (an aqueous phosphoric acid solution) is stored in the etching processing bath 34. A rinse processing liquid (e.g., deionized water) is stored in the rinse processing bath 35.

The cleaning device 25 and the etching device 26 have the same configuration. Descriptions will be made on the etching device 26. One lot including the plurality of substrates 8 is held in each of the substrate elevating mechanisms 36 and 37 to be aligned in the vertical posture in the front-rear direction. The etching device 26 receives a lot from the substrate holder 22 of the lot conveyance mechanism 19 by the substrate elevating mechanism 36 and elevates the received lot by the substrate elevating mechanism 36 so that the lot is immersed in the etching processing liquid in the processing bath 34 to etch the substrates 8. Then, the etching device 26 delivers the lot from the substrate elevating mechanism 36 to the substrate holder 22 of the lot conveyance mechanism 19. The etching device 26 receives the lot from the substrate holder 22 of the lot conveyance mechanism 19 by the substrate elevating mechanism 37 and elevates the received lot by the substrate elevating mechanism 37 so that the lot is immersed in the rinse processing liquid in the processing bath 35 to rinse the substrates 8. Then, the etching device 26 delivers the lot from the substrate elevating mechanism 37 to the substrate holder 22 of the lot conveyance mechanism 19.

In the etching device 26, an aqueous solution of a chemical agent (phosphoric acid) at a predetermined concentration (88.3 wt % of an aqueous phosphoric acid solution) is used as a processing liquid (an etching liquid) to perform a liquid processing (an etching processing) on the substrates 8.

Figure 2:
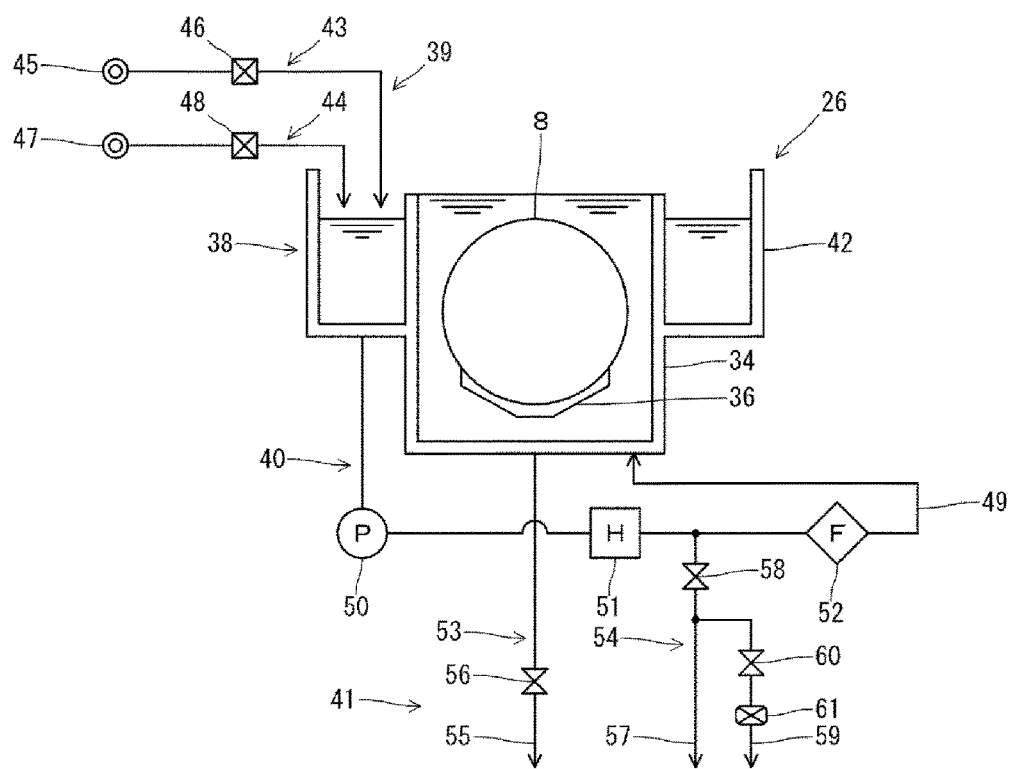
FIG. 2 is an explanatory view illustrating an etching device.

As illustrated in FIG. 2, the etching device 26 includes: a processing liquid storage unit 38 that stores the processing liquid comprised of an aqueous phosphoric acid solution at a predetermined concentration (88.3 wt % of an aqueous phosphoric acid solution) and processes the substrates 8; a processing liquid supply unit 39 that supplies the processing liquid to the processing liquid storage unit 38; a processing liquid circulation unit 40 that circulates the processing liquid stored in the processing liquid storage unit 38; and a processing liquid discharging unit 41 that discharges the processing liquid from the processing liquid storage unit 38.

The processing liquid storage unit 38 includes a top-opened outer bath 42 formed at the periphery of the upper portion of the top-opened processing bath 34, and stores the processing liquid in the processing bath 34 and the outer bath 42. The processing bath 34 stores the processing liquid in which the substrates 8 are immersed by the substrate elevating mechanism 36 and subjected to a liquid processing. The outer bath 42 stores the processing liquid overflowing from the processing bath 34, and supplies the processing liquid to the processing bath 34 by the processing liquid circulation unit 40.

The processing liquid supply unit 39 includes an aqueous solution supply unit 43 that supplies an aqueous solution of a chemical agent (phosphoric acid) (85 wt % of an aqueous phosphoric acid solution) at a concentration different from (lower than) the processing liquid to the processing liquid storage unit 38, and a water supply unit 44 that supplies water (deionized water) to the processing liquid storage unit 38.

The aqueous solution supply unit 43 is connected to the outer bath 42 of the processing liquid storage unit 38 via a flow rate regulator 46 to supply the aqueous phosphoric acid solution at a predetermined concentration (85 wt %) at a predetermined temperature (25° C.). The flow rate regulator 46 is connected to the controller 7, and its opening/closing and flow rate are controlled by the controller 7.

In the water supply unit 44, a water supply source 47 is connected to the outer bath 42 of the processing liquid storage unit 38 via a flow rate regulator 48 to supply the deionized water at a predetermined temperature (25° C.). The flow rate regulator 48 is connected to the controller 7, and its opening/closing and flow rate are controlled by the controller 7.

The processing liquid circulation unit 40 includes a circulation flow path 49 formed between a bottom of the outer bath 42 of the processing liquid storage unit 38 and a bottom of the processing bath 34. A pump 50, a heater 51, and a filter 52 are sequentially provided in the circulation flow path 49. The pump 50 and the heater 51 are connected to the controller 7, and driven by the controller 7. The processing liquid circulation unit 40 circulates the processing liquid from the outer bath 42 to the processing bath 34 by driving the pump 50. At that time, the processing liquid is heated up to a predetermined temperature (165° C.) by the heater 51.

The processing liquid discharging unit 41 includes a first processing liquid discharge unit 53 configured to discharge the processing liquid from the processing liquid storage unit 38, and a second processing liquid discharge unit 54 configured to discharge the processing liquid from the processing liquid circulation unit 40.

In the first processing liquid discharge unit 53, a discharge flow path 55 is connected to the bottom of the processing bath 34 of the processing liquid storage unit 38. The discharge flow path 55 communicates with an external drain, and is provided with an opening/closing valve 56. The opening/closing valve 56 is connected to the controller, and its opening/closing is controlled by the controller 7.

In the second processing liquid discharge unit 54, a discharge flow path 57 is connected to a middle portion of the circulation flow path 49 of the processing liquid circulation unit 40 (between the heater 51 and the filter 52). The discharge flow path 57 communicates with an external drain, and is provided with an opening/closing valve 58. Further, a bypass flow path 59 is connected to a middle portion of the discharge flow path 57 (at a downstream side of the opening/closing valve 58). The bypass flow path 59 communicates with an external drain, and is provided with an opening/closing valve 60 and a concentration sensor 61 that measures a silicon concentration, in sequence. The opening/closing valves 58, 60 are connected to the controller 7, and their opening/closing is controlled by the controller 7. The concentration sensor 61 is connected to the controller 7, and the silicon concentration in the processing liquid is measured by the controller 7.

As described above, in the substrate liquid processing apparatus 1, the concentration sensor 61 is provided in the second processing liquid discharge unit 54 branched from the processing liquid circulation unit 40. Thus, concentration sensor 61 is in contact with the processing liquid only when the processing liquid is discharged from the processing liquid circulation unit 40. Therefore, in the substrate liquid processing apparatus 1, it is possible to suppress any failure or malfunction of the concentration sensor 61 due to erosion of the concentration sensor 61 or adherence of impurities contained in the processing liquid to the concentration sensor 61. Further, in the substrate liquid processing apparatus 1, it is possible to suppress unsatisfactory liquid processing of the substrates 8 which is caused by particles attached to the substrates 8 as dusts are precipitated from the concentration sensor 61 and incorporated into the processing liquid.

Here, the concentration sensor 61 is provided in the bypass flow path branched from the discharge flow path 57 as illustrated in FIG. 2 and FIG. 3A, but not limited thereto. The concentration sensor 61 may be provided in the bypass flow path 62 branched from the circulation flow path 49 as illustrated in FIG. 3B, or may be provided in the discharge flow path 57 as illustrated in FIG. 3C. When the concentration sensor 61 is provided in the discharge flow path 57, the concentration sensor 61 is in contact with only a part of the processing liquid stored in the processing liquid storage unit 38 (the processing liquid discharged from the processing liquid circulation unit 40). When the concentration sensor 61 is provided in the bypass flow path 59 or 62, the concentration sensor 61 is in contact with only a part of the processing liquid discharged from the processing liquid circulation unit 40 (the processing liquid discharged from the bypass flow paths 59 or 62). Therefore, when the concentration sensor 61 is provided in the bypass flow path 59 or 62, it is possible to further shorten (reduce) the time (frequency) for which the concentration sensor 61 is in contact with the processing liquid.

The etching device 26 causes the aqueous solution supply unit 43 to supply an aqueous phosphoric acid solution at a predetermined concentration (85 wt %) and a predetermined temperature (25° C.) to the processing liquid storage unit 38, and causes the processing liquid circulation unit 40 to heat the supplied solution up to a predetermined concentration (88.3 wt %) and a predetermined temperature (165° C.) to generate a processing liquid so that the generated processing liquid is stored in the processing liquid storage unit 38. Further, the etching device 26 causes the water supply unit 44 to supply deionized water in an amount corresponding to the amount of water evaporated by the heating to the processing liquid storage unit 38. Accordingly, the etching device 26 stores the processing liquid at a predetermined concentration (88.3 wt %) and a predetermined temperature (165° C.) in the processing bath 34 of the processing liquid storage unit 38 and immerses the substrates 8 in the processing liquid by the substrate elevating mechanism 36, thereby etching the substrates 8.

Further, the etching device 26 discharges a part (or all) of the processing liquid in the processing liquid storage unit 38 by the processing liquid discharging unit 42 and newly supplies the processing liquid (an aqueous solution and/or deionized water) by the processing liquid supply unit 39 to properly update (exchange) the processing liquid stored in the processing liquid storage unit 38.

The controller 7 controls operations of the respective units of the substrate liquid processing apparatus 1 (for example, the carrier carry-in/out unit 2, the lot forming unit 3, the lot mounting unit 4, the lot conveyance unit 5, and the lot processing unit 6).

The controller 7 is, for example, a computer, and is provided with a computer-readable storage medium 56. In the storage medium 56, a program is stored to control various processings to be executed in the substrate liquid processing apparatus 1. The controller 7 reads out and executes the program stored in the storage medium 56 to control the operation of the substrate liquid processing apparatus 1. Meanwhile, the program is stored in the computer-readable storage medium 56, and may be installed to the storage medium 56 of the controller 7 from another storage medium. The computer-readable storage medium 56 may include, for example, a hard disk (HD), a flexible disk (FD), a compact disk (CD), a magneto-optical disk (MO), and a memory card.

The substrate liquid processing apparatus 1 is configured as described above. The controller 7 controls the operations of the respective units (for example, the carrier carry-in/out unit 2, the lot forming unit 3, the lot mounting unit 4, the lot conveyance unit 5, and the lot processing unit 6) to process the substrates 8.

Figure 4:
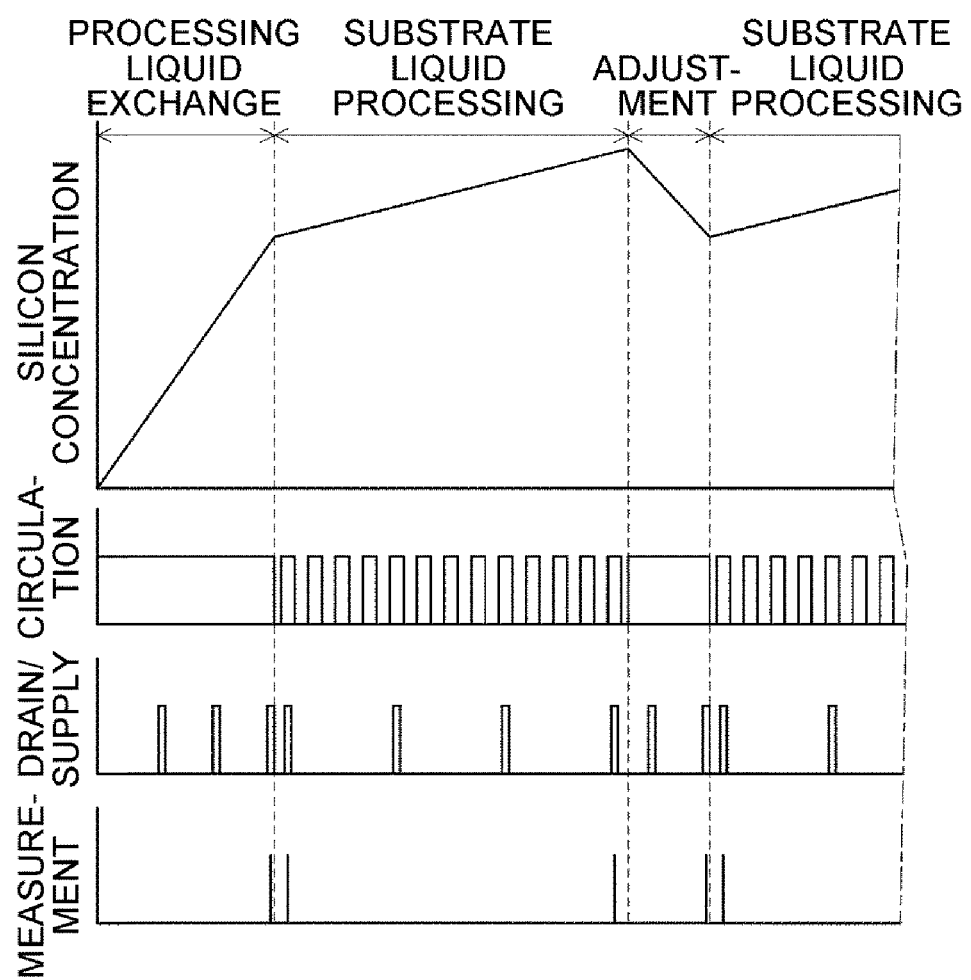
FIG. 4 is an explanatory view illustrating a processing liquid processing method.

When the substrates 8 are etched by the substrate liquid processing apparatus 1, the controller 7 controls, for example, the etching device 26 according to the substrate liquid processing program stored in the storage medium 56, as described below (see FIG. 4).

First, the substrate liquid processing apparatus 1 exchanges the processing liquid stored in the processing liquid storage unit 38 before starting an etching of the substrates 8 (a processing liquid exchange step).

In the processing liquid exchange step, the controller 7 causes the processing liquid supply unit 39 to supply the processing liquid to the processing liquid storage unit 38, and causes the processing liquid circulation unit 40 to circulate and heat the processing liquid, so that a processing liquid at a predetermined concentration (88.3 wt %) and a predetermined temperature (165° C.) is generated. Thereafter, the controller 7 causes the substrate elevating mechanism 36 to immerse dummy silicon wafers in the processing liquid for a predetermined period of time, so that the silicon concentration in the processing liquid is set to a predetermined concentration. In the processing liquid exchange step, the controller 7 causes the processing liquid circulation unit 40 to circulate the processing liquid, and causes the opening/closing valve 58 to be opened at a predetermined timing so that the processing liquid is drained from the processing liquid circulation unit 40 through the second processing liquid discharge unit 54. Then, the controller 7 causes the opening/closing valve 60 to be opened at a predetermined timing (e.g., immediately before the completion of the processing liquid exchange step) so that the silicon concentration in the processing liquid is measured by the concentration sensor 61. When the silicon concentration measured by the concentration sensor 61 does not fall within a predetermined concentration range, the controller 7 alerts and stops the processing. Meanwhile, in the processing liquid exchange step, the processing liquid may be circulated constantly or intermittently by the processing liquid circulation unit 40. Alternatively, for example, when the dummy silicon wafers are immersed in the processing liquid for a predetermined period of time, the circulation may be temporarily stopped immediately after the silicon wafers are immersed, and then, the processing liquid may be circulated at a predetermined timing.

Here, by examining the relationship between the immersion time of the silicon wafers and the silicon concentration in advance, the dummy silicon wafers are immersed in the processing liquid for a predetermined period of time so that the silicon concentration falls within a predetermined concentration range. However, the control may be performed such that the silicon concentration is measured by the concentration sensor 61 at a predetermined timing, and then, the dummy silicon wafers are immersed in the processing liquid until the silicon concentration falls within a predetermined concentration range. Meanwhile, when the timing of opening the opening/closing valve 60 to measure the silicon concentration by the concentration sensor 61 is set to be less frequent than the timing of opening the opening/closing valve 58 to discharge the processing liquid, the time (frequency) for which the concentration sensor 61 is in contact with the processing liquid may be further shortened (reduced).

After the silicon concentration measured by the concentration sensor 61 falls within the predetermined concentration range, the substrate liquid processing apparatus 1 performs an etching of the substrates 8 (a substrate liquid processing step).

In the substrate liquid processing step, a substrate carry-in step of carrying the substrates 8 into the processing bath 34, a substrate processing step of processing the substrates 8 in the processing bath 34, and a substrate carry-out step of carrying the substrates 8 out from the processing bath 34, are performed.

In the carry-in step, after the substrate elevating mechanism 36 is moved up from the inside of the processing bath 34, one lot including the substrates 8 which will be processed at once is carried from the lot conveyance mechanism 19 to the substrate elevating mechanism 36. Then, the substrate elevating mechanism 36 holding the substrates 8 is moved down to the inside of the processing bath 34.

Accordingly, the substrates 8 are immersed in the processing liquid stored in the processing bath 34.

In the substrate processing step, the substrate elevating mechanism 36 is maintained in a state of being moved down to the inside of the processing bath 34 for a predetermined period of time. Accordingly, the substrates 8 are immersed in the processing liquid for the predetermined period of time, so that the substrates 8 are etched.

In the carry-out step, after the substrate elevating mechanism 36 holding the substrates 8 is moved up from the inside of the processing bath 34, the substrates 8 of one lot, which have been processed at once, are conveyed from the substrate elevating mechanism 36 to the lot conveyance mechanism 19.

In the substrate liquid processing step, when the substrates 8 are etched by the processing liquid, the concentration of silicon contained in the processing liquid is gradually increased. Since the capability (etching rate) of the processing liquid depends on the silicon concentration of the processing liquid, the silicon concentration of the processing liquid needs to be maintained within a predetermined concentration range. Therefore, the controller 7 causes the pump 50 to be driven during the etching of the substrates 8 so that the processing liquid is circulated by the processing liquid circulation unit 40, causes the opening/closing valve 58 to be opened intermittently at a predetermined timing so that a part of the processing liquid is discharged from the processing liquid circulation unit 40 through the second processing liquid discharge unit 54, and causes the processing liquid supply unit 39 to newly supply the processing liquid. Then, the controller 7 causes the opening/closing valve 60 to be opened at a predetermined timing (e.g., immediately after the initiation of the substrate liquid processing step or immediately before the termination) so that the silicon concentration in the processing liquid is measured by the concentration sensor 61. When the silicon concentration measured by the concentration sensor 61 does not fall within a predetermined concentration range, the controller 7 alerts and stops the processing. Meanwhile, in the substrate liquid processing step, the processing liquid may be circulated constantly or intermittently by the processing liquid circulation unit 40.

Here, a relationship of the silicon concentration with the etching time of the substrates 8, the discharge amount of the processing liquid during the etching, and the supply amount of the new processing liquid is examined in advance. Then, a predetermined amount of the processing liquid is discharged during the etching of the substrates 8, and a predetermined amount of the processing liquid is newly supplied, so that the silicon concentration falls within the predetermined concentration range. However, the control may be performed such that the silicon concentration is measured by the concentration sensor 61 at a predetermined timing, and then, when the silicon concentration is the predetermined concentration or more, the substrate liquid processing step is terminated. Similarly, when the timing of opening the opening/closing valve 60 to measure the silicon concentration by the concentration sensor 61 is set to be less frequent than the timing of opening the opening/closing valve 58 to discharge the processing liquid, the time (frequency) for which the concentration sensor 61 is in contact with the processing liquid may be further shortened (reduced).

After the substrate carry-in step, the substrate processing step, and the substrate carry-out step are repeated a predetermined number of times, the substrate liquid processing apparatus 1 adjusts the silicon concentration in the processing liquid to fall within a predetermined range (an adjustment step).

In the adjustment step, the controller 7 causes the processing liquid supply unit 39 to supply the processing liquid to the processing liquid storage unit 38, and causes the processing liquid circulation unit 40 to circulate and heat the processing liquid, so that a processing liquid at a predetermined concentration (88.3 wt %) and a predetermined temperature (165° C.) is generated, and the silicon concentration in the processing liquid is set to a predetermined concentration. In the adjustment step, the controller 7 causes the processing liquid circulation unit 40 to circulate the processing liquid, and causes the opening/closing valve 58 to be opened intermittently at a predetermined timing so that the processing liquid is drained from the processing liquid circulation unit 40 through the second processing liquid discharge unit 54, and causes the processing supply unit 39 to newly supply the processing liquid. Then, the controller 7 causes the opening/closing valve 60 to be opened at a predetermined timing (e.g., immediately before the completion of the adjustment step) so that the silicon concentration in the processing liquid is measured by the concentration sensor 61. When the silicon concentration measured by the concentration sensor 61 does not fall within a predetermined concentration range, the controller 7 alerts and stops the carry-in of the substrates 8 into the processing bath. Meanwhile, in the adjustment step, the processing liquid may be circulated constantly or intermittently by the processing liquid circulation unit 40. Alternatively, the circulation may be temporarily stopped, and then, the processing liquid may be circulated at a predetermined timing.

Here, by examining the relationship of the silicon concentration with the discharge amount of the processing liquid and the supply amount of the new processing liquid in advance, the predetermined amount of the processing liquid is discharged and the predetermined amount of the processing liquid is newly supplied so that the silicon concentration falls within a predetermined concentration range. However, the control may be performed such that the silicon concentration is measured by the concentration sensor 61 at a predetermined timing, the processing liquid is discharged until the silicon concentration falls within a predetermined concentration range, and then, the new processing liquid is supplied. Meanwhile, when the timing of opening the opening/closing valve 60 to measure the silicon concentration by the concentration sensor 61 is set to be less frequent than the timing of opening the opening/closing valve 58 to discharge the processing liquid, the time (frequency) for which the concentration sensor 61 is in contact with the processing liquid may be further shortened (reduced).

As described above, in the substrate liquid processing apparatus 1, the processing liquid for processing the substrates 8, which is stored in the processing liquid storage unit 38, is circulated by the processing liquid circulation unit 40, the circulated processing liquid is discharged from the second processing liquid discharge unit 54 branched in the middle of the processing liquid circulation unit 40, and the silicon concentration in the discharged processing liquid is measured by the concentration sensor 61 provided in the second processing liquid discharge unit 54.

Therefore, in the substrate liquid processing apparatus 1, since the time for which the concentration sensor 61 is in contact with the processing liquid may be shortened, generation of failure or malfunction of the concentration sensor 61 is suppressed. In addition, it is possible to suppress the substrates 8 from being attached with particles generated when dusts are precipitated from the concentration sensor 61. Accordingly, the substrates 8 may be satisfactorily subjected to a liquid processing.

Figure 5:
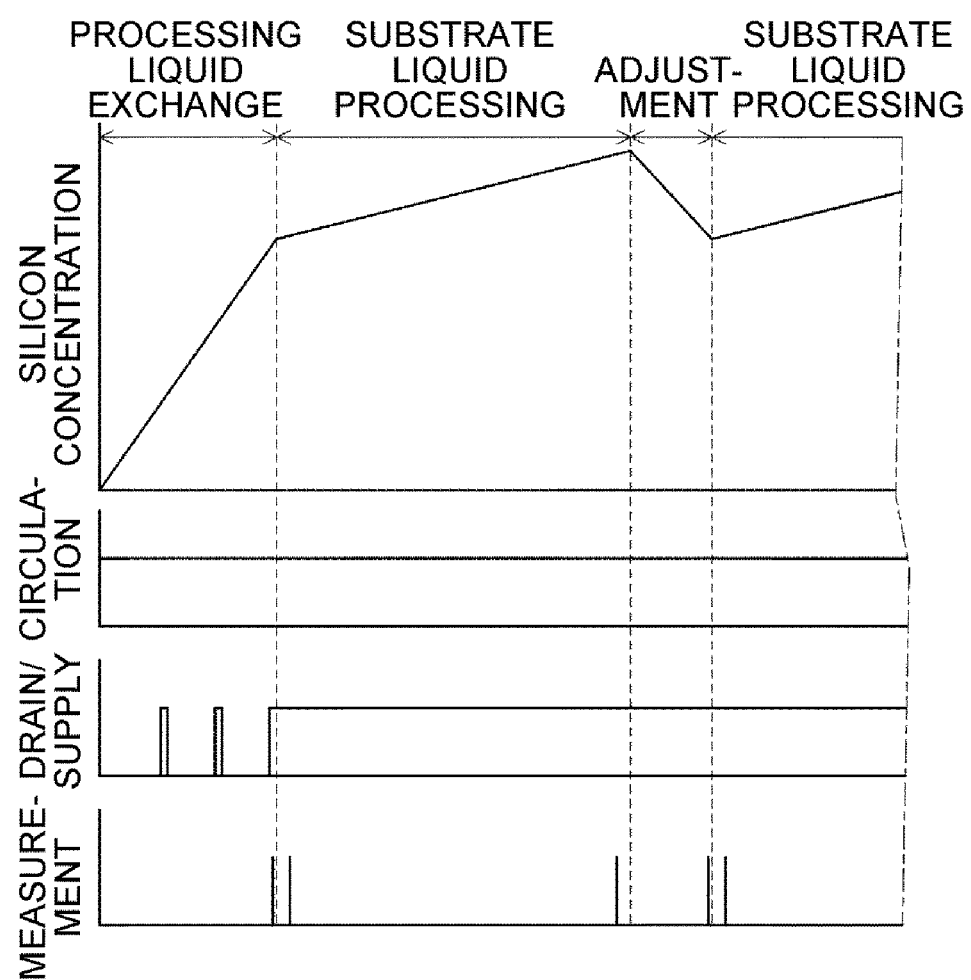
FIG. 5 is an explanatory view illustrating another processing liquid processing method.

Meanwhile, another exemplary embodiment will be described. In an exemplary embodiment illustrated in FIG. 4, in order to maintain the silicon concentration in the processing liquid within a constant concentration range in the substrate liquid processing step and the adjustment step, the controller 7 causes the pump 50 to be driven during the etching of the substrates 8 so that the processing liquid is circulated by the processing liquid circulation unit 40, causes the opening/closing valve 58 to be opened intermittently at a predetermined timing so that a part of the processing liquid is discharged from the processing liquid circulation unit 40 through the second processing liquid discharge unit 54, and causes the processing liquid supply unit 39 to newly supply the processing liquid. Without being limited thereto, however, as illustrated in FIG. 5, the controller 7 may cause the opening/closing valve 58 to be opened constantly for a predetermined period of time so that a part of the processing liquid is discharged from the processing liquid circulation unit 40 through the second processing liquid discharge unit 54, and cause the processing liquid supply unit 39 to newly supply the processing liquid.

Further, in the substrate liquid processing step, the processing liquid may be discharged continuously from the initiation of the substrate liquid processing step to the middle of the step, and then, the processing liquid is supplied. Thereafter, the processing liquid may be neither discharged nor the supplied. Further, the processing liquid may be neither discharged nor the supplied from the initiation of the substrate liquid processing step to the middle of the step, but discharged continuously from the middle to the termination. Then, the processing liquid may be supplied.

Further, in still another exemplary embodiment, when the timing of opening the opening/closing valve 60 to measure by concentration sensor 61 is set to a predetermined timing while the processing is discharged by opening the opening/closing valve 58 (e.g., immediately after the initiation of the substrate liquid processing step or immediately before the termination), the time (frequency) for which the concentration sensor 61 is in contact with the processing liquid may be further shortened (reduced).

Further, in yet another exemplary embodiment, for example based on values obtained by measuring the silicon concentration in the processing liquid a plurality of times by the concentration sensor 61 provided in the second processing liquid discharge unit 54, an increase rate of the silicon concentration in the substrate liquid processing step may be obtained from a plurality of the measurement values. Then, when it is determined that the silicon concentration would exceed a predetermined concentration range during the processing of the substrates 8, the discharge amount of the processing liquid to be discharged and the supply amount of the new processing liquid to be supplied may be corrected such that the silicon concentration does not exceed the predetermined concentration range.

Further, in still yet exemplary embodiment, in order to further shorten (reduce) the time (frequency) for which the concentration sensor 61 is in contact with the processing liquid, the processing liquid may be removed, for example, by supplying an inert gas or deionized water to the concentration sensor 61 provided in the second processing liquid discharge unit 54, so that the processing liquid does not remain when the processing liquid is not allowed to pass through the concentration sensor 61.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate liquid processing apparatus comprising:
a processing liquid storage unit configured to store a processing liquid for processing a substrate;
a processing liquid supply unit configured to supply the processing liquid to the processing liquid storage unit;
a processing liquid circulation unit configured to circulate the processing liquid inside the processing liquid storage unit;
a processing liquid discharge unit including a discharge flow path branched from the processing liquid circulation unit and communicating with an external drain to discharge the processing liquid;
a concentration sensor provided in the discharge flow path and configured to measure a concentration in the processing liquid, the concentration sensor being separated from the processing liquid storage; and
a controller configured to control the processing liquid supply unit,
wherein the controller controls the processing liquid circulation unit to circulate the processing liquid, the processing liquid discharge unit to discharge the circulated processing liquid intermittently at a predetermined timing or continuously for a predetermined period of time, the processing liquid supply unit to newly supply the processing liquid, and the concentration sensor to measure the concentration in the processing liquid at a predetermined timing with respect to the discharged processing liquid.

2. The substrate liquid processing apparatus of claim 1, wherein the concentration sensor is provided in a bypass flow path branched from the processing discharge unit.

3. The substrate liquid processing apparatus of claim 1, wherein the predetermined timing of measuring the concentration in the processing liquid by the concentration sensor is set when the substrate is processed with the processing liquid.

4. The substrate liquid processing apparatus of claim 1, wherein the predetermined timing of measuring the concentration in the processing liquid by the concentration sensor is set to be less frequent than the predetermined timing of discharging the processing liquid from the processing liquid discharge unit.

5. The substrate liquid processing apparatus of claim 1, wherein a silicon wafer is used as the substrate, and the concentration sensor measures a concentration of silicon in the processing liquid.

6. The substrate liquid processing apparatus of claim 1, wherein the controller is programmed to calculate an increase rate of the concentration in a substrate liquid processing step based on a plurality of values measured by the concentration sensor, and
when it is determined that the concentration exceeds a predetermined concentration range during processing of the substrate, the controller is programmed to correct a discharge amount of the processing liquid to be discharged and a supply amount of new processing liquid to be supplied such that the concentration does not exceed the predetermined concentration range.

7. The substrate liquid processing apparatus of claim 1, wherein an inert gas or deionized water is supplied to the concentration sensor provided in the processing liquid discharge unit when the processing liquid does not pass through the concentration sensor.

8. A substrate liquid processing method comprising:
storing a processing liquid for processing a substrate in a processing liquid storage unit;
circulating the processing liquid by a processing liquid circulation unit;
discharging the circulated processing liquid intermittently at a predetermined timing or continuously for a predetermined period of time from a processing liquid discharge unit having a discharge flow path branched in the middle of the processing liquid circulation unit and communicating with an external drain to discharge the processing liquid;
newly supplying the processing liquid from a processing liquid supply unit; and
measuring a concentration in the processing liquid at a predetermined timing with respect to the discharged processing liquid, by a concentration sensor provided in the discharge flow path, the concentration sensor being separated from the processing liquid storage.

9. The substrate liquid processing method of claim 8, wherein the processing liquid discharged from the processing liquid discharge unit is allowed to flow in a bypass flow path branched in the middle of the processing discharge unit, and the concentration in the processing liquid is measured by the concentration sensor provided in the bypass flow path.

10. The substrate liquid processing method of claim 8, wherein the predetermined timing of measuring the concentration in the processing liquid by the concentration sensor is set when the substrate is processed with the processing liquid.

11. A non-transitory computer-readable storage medium that stores a computer-executable program for performing a liquid processing on a substrate using a substrate liquid processing apparatus, the substrate liquid processing apparatus including:
a processing liquid storage unit configured to store a processing liquid for processing a substrate;
a processing liquid supply unit configured to supply the processing liquid to the processing liquid storage unit;
a processing liquid circulation unit configured to circulate the processing liquid inside the processing liquid storage unit;
a processing liquid discharge unit including a discharge flow path branched from the processing liquid circulation unit and communicating with an external drain to discharge the processing liquid; and
a concentration sensor provided in the discharge flow path and configured to measure a concentration in the processing liquid, the concentration sensor being separated from the processing liquid storage,
the liquid processing on the substrate comprising:
storing the processing liquid for processing the substrate in the processing liquid storage unit;
circulating the processing liquid by the processing liquid circulation unit
discharging the circulated processing liquid intermittently at a predetermined timing or continuously for a predetermined period of time from the processing liquid discharge unit;
newly supplying the processing liquid from the processing liquid supply unit; and
measuring a concentration in the processing liquid at a predetermined timing with respect to the discharged processing liquid, by the concentration sensor.

* * * * *